US008963168B1

(12) United States Patent
Rettke

(10) Patent No.: US 8,963,168 B1
(45) Date of Patent: Feb. 24, 2015

(54) LED LAMP USING BLUE AND CYAN LEDS AND A PHOSPHOR

(71) Applicant: Nthdegree Technologies Worldwide Inc., Tempe, AZ (US)

(72) Inventor: Reuben Rettke, Phoenix, AZ (US)

(73) Assignee: Nthdegree Technologies Worldwide Inc., Tempe, AZ (US)

( * ) Notice: Subject to any disclaimer, the term of this patent is extended or adjusted under 35 U.S.C. 154(b) by 0 days.

(21) Appl. No.: 14/542,192

(22) Filed: Nov. 14, 2014

Related U.S. Application Data

(62) Division of application No. 13/436,613, filed on Mar. 30, 2012, now Pat. No. 8,906,713.

(51) Int. Cl.
*H01L 27/15* (2006.01)
*H01L 31/12* (2006.01)
*H01L 33/00* (2010.01)
*H01L 25/075* (2006.01)
*H01L 33/50* (2010.01)

(52) U.S. Cl.
CPC .......... *H01L 25/0753* (2013.01); *H01L 33/502* (2013.01)
USPC .. 257/79; 257/89; 257/E33.001; 257/E31.127

(58) Field of Classification Search
USPC .............. 257/79, 80, 89, 91, 95, 98, E33.001, 257/E31.127
See application file for complete search history.

(56) References Cited

U.S. PATENT DOCUMENTS

| 7,213,940 | B1 | 5/2007 | Van De Ven et al. | |
|---|---|---|---|---|
| 2009/0085478 | A1* | 4/2009 | Cok et al. | 313/506 |
| 2009/0237467 | A1 | 9/2009 | Yamazaki et al. | |
| 2011/0037413 | A1 | 2/2011 | Negley et al. | |
| 2011/0132521 | A1 | 6/2011 | Paolini et al. | |

OTHER PUBLICATIONS

International Search Report and Written Opinion, 11 pages.
Roya Mirhosseini et al., "Improved color rendering and luminous efficacy in phosphor-converted white light-emitting diodes by use of dual-blue emitting active regions", Paper, Optics Express, vol. 17, No. 13, Jun. 22, 2009, 8 pages.

* cited by examiner

*Primary Examiner* — Hoai V Pham
(74) *Attorney, Agent, or Firm* — Patent Law Group LLP; Brian D. Ogonowsky

(57) ABSTRACT

Many thousands of micro-LEDs (e.g., 25 microns per side) are deposited on a substrate. Some of the LEDs are formed to emit a peak wavelength of 450 nm (blue), and some are formed to emit a peak wavelength of 490 nm (cyan). A YAG (yellow) phosphor is then deposited on the LEDs, or a remote YAG layer is used. YAG phosphor is most efficiently excited at 450 nm and has a very weak emission at 490 nm. The two types of LEDs are GaN based and can be driven at the same current. The ratio of the two types of LEDs is controlled to achieve the desired overall color emission of the LED lamp. The blue LEDs optimally excite the YAG phosphor to produce white light having blue and yellow components, and the cyan LEDs broaden the emission spectrum to increase the CRI of the lamp while improving luminous efficiency. Other embodiments are described.

15 Claims, 5 Drawing Sheets

LED LAMP USING BLUE AND CYAN LEDS AND A PHOSPHOR

CROSS-REFERENCE TO RELATED APPLICATIONS

This application is a divisional of U.S. application Ser. No. 13/436,613, filed on Mar. 30, 2012, incorporated herein by reference.

FIELD OF THE INVENTION

This invention relates to phosphor-converted (PC) light emitting diode (LED) lamps that generate white light and, more particularly, to a PC LED lamp that uses LEDs emitting at two different peak wavelengths to improve the color rendering and luminous efficacy of the lamp.

BACKGROUND

Commercially available LEDs typically emit a single color (peak wavelength). Some experimental LED chips have been produced that can produce multiple peak wavelengths. However, such LEDs are fabricated using special techniques that add significant expense, making them not yet commercially viable.

The most common white-light LED uses a 450 nm blue LED that excites a relatively broad emission YAG:Ce phosphor deposited over the LED. The peak emission wavelength of YAG is about 535-565 nm (yellow-green). The blue light leaks through the YAG layer, and the combination of the blue and yellow light (phosphor converted blue light) creates white light. Such a di-chromatic light source produces relatively poor color rendering, since the highest color rendering is produced with a broad-spectrum source, such as the sun or a radiating black body.

The color rendering index (CRI) is a quantitative measure of the ability of a light source to faithfully reproduce the colors of certain sample patches in comparison with an ideal or natural light source, such as the sun, at the same color temperature. The sun has a CRI of 100.

It is known to use a blue LED to excite a combination of red, yellow, and green phosphors to produce a broader spectrum having a high CRI. However, combining and depositing phosphors to produce a consistent emitted color is difficult. Phosphors are also relatively expensive and reduce the efficiency of the LED. Additionally, the environmental impact of mining phosphors is significant and growing due to the increased use of phosphors.

Another problem with phosphors is that the color cannot be controlled once the phosphor is deposited over the LED.

It is known to combine red, green, and blue LEDs in a module to produce white light, but each LED needs its own current source, and the different LEDs react differently to heat. Accordingly, such LED modules have better CRI but lack color stability and are expensive.

What is needed is a technique for fabricating a white light source that improves CRI, luminous efficiency, and color control without the drawbacks discussed above.

SUMMARY

In one embodiment, thousands of micro-LEDs (e.g., 25 microns per side) are deposited on a substrate, and electrical connections are made using a transparent conductor layer. Some of the LEDs are formed to emit a peak wavelength of 450 nm (blue), and some are formed to emit a peak wavelength of 490 nm (cyan). The two types of LEDs are GaN based and can be driven at the same current. The two types of LEDs react similarly to heat. The ratio of the two types of LEDs is controlled to achieve the desired overall color emission of the LED lamp. In one embodiment, a yellow phosphor, such as YAG, is then deposited on the LEDs, or a remote yellow phosphor layer is used. YAG phosphor is most efficiently excited at 450 nm and has a very weak emission at 490 nm. The blue LED efficiently excites the yellow phosphor to produce white light having blue and yellow components, and the cyan LED adds a green component to increase the CRI of the light emission and luminous efficiency.

In one embodiment, a red phosphor is mixed with the YAG phosphor or overlies the YAG phosphor to create a warmer white light. If a red phosphor and yellow phosphor were used with different peak excitation wavelengths, then controlling the blue/cyan ratio or separately controlling the blue and cyan LEDs with currents controls the relative red/yellow contributions of the phosphors to the white light.

In another embodiment, the relatively broad emission YAG phosphor is not used. Instead, a combination of red and non-YAG yellow phosphors are deposited at least over the blue LEDs or used remotely. The blue wavelength is optimized for the phosphor. The cyan LEDs, which may not be covered by any phosphor, obviates the need for a green phosphor to broaden the spectrum, improving the efficiency of the lamp and improving color consistency.

This dual LED approach has been shown to improve luminous efficiency and generate a higher CRI due to the broader spectrum generated Improving the luminous efficiency is due to lower phosphor usage and generating an emission that better conforms to the luminous efficiency function of the human visual system.

In one embodiment, the micro-LEDs are combined together in a liquid medium (as an LED ink) and screen printed, slot-die coated, sprayed, or otherwise deposited onto a metal layer on a substrate. The LED chips, in one embodiment, have a reflective metal (e.g., silver) electrode (an anode or cathode electrode) covering the bottom surface of the chip and a distributed metal electrode on the top surface of the chip to allow light to pass through the top surface of the chip. The LEDs self-orient themselves as they sink through the liquid medium so that the bottom electrode tends to face the metal layer on the substrate. Since the large metal bottom electrode has a density that is much greater than the GaN semiconductor, the LEDs tend to orient with their bottom electrode side down. Self-orientation may be accomplished in various other ways.

The structure is then heated (or otherwise cured) to evaporate the liquid medium (a solvent) and bond the silver electrode to the metal layer on the substrate. In one example, the metal layer on the substrate is an uncured aluminum layer, deposited by, for example, slot-die coating, and the layer is heated to cure the aluminum layer while bonding the LED electrodes to the aluminum.

In another embodiment, the blue and cyan LEDs are separately printed onto the substrate's metal layer in different areas or zones so that they can be separately electrically contacted and energized. The yellow phosphor may be printed over only the blue LEDs or over a combination of the blue and cyan LEDs in a separate zone. The YAG or yellow phosphor may be mixed with a red phosphor. Some of the blue and cyan LEDs may not be covered by the phosphor. The three groups of LEDs may then be separately controlled by different current sources to select the amount of blue, cyan, and phosphor wavelengths to generate a target color.

Correlated color temperature (CCT) is a specification of the color appearance of the light emitted by a lamp, relating its color to the color of light from a black body reference source (a Planckian reference) when heated to a particular temperature, measured in Kelvin (K).

Luminous efficacy of radiation (LER) is luminous flux divided by radiant flux, where the luminous flux is a measure of perceived brightness to a human eye (taking into account the luminosity function of the eye), and the radiant flux is the total flux output of the light source independent of wavelength. The SI units for LER are lumens per Watt. The maximum LER value is 683 lm/w at 555 nm (green light), where the human eye is most sensitive. The theoretical maximum for white light depends of the color temperature and spectral power distribution (SPD).

The lamp is engineered for the warmest CCT, such as 2700K. Then, by increasing the amount of blue and/or cyan, the color is cooled to higher CCTs. For example, at one setting, the lamp may produce a CCT of 2700K with a CRI of 94 and a LER of 288 lm/W. Then, by increasing the current to the blue and/or cyan LEDs not covered by the phosphor, the light can be cooled to 4000K or 6000K, for example. All points on the Planckian locus may be possible. Dynamically adjusting the light throughout the day for a circadian rhythm is achievable.

The phosphor layer may be replaced by a quantum dot layer.

In another embodiment, much larger and conventional 450 nm and 490 nm LED chips (e.g., 0.5 mm per side) may be positioned on the substrate using pick and place tools or using another method. The usage of the phosphor and separate controlling of the blue and cyan LEDs may be the same as described above to achieve a higher CRI and improved LER.

The 490 nm LEDs may be replaced with GaN LEDs emitting a longer peak wavelength (closer to green), such as 507 nm, to obtain a high scotopic response, since the scotopic response typically peaks at 507 nm. This would result in the lamp appearing brighter than actually measured. In other words, it would increase the pupil lumens.

Other peak emissions of the two types of LEDs may be used to improve CRI and LER.

Thus, by using the inventive technique, there is less energy loss due to phosphor conversion, the luminous efficacy is improved, the CRI is increased, and the color can be controlled.

Other embodiments are described.

BRIEF DESCRIPTION OF THE DRAWINGS

Elements that are similar or identical in the various figures are labeled with the same numeral.

DETAILED DESCRIPTION

Figure 1:
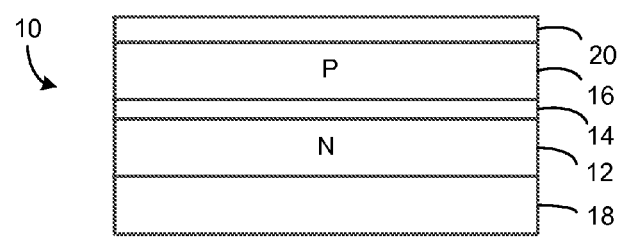
FIG. 1 is a cross-sectional view of a micro-LED chip, emitting a peak wavelength of, for example, either 450 nm or 490 nm. The LED has a reflective metal bottom electrode and a distributed top electrode that allows light to escape.

FIG. 1 is a cross-sectional view of a micro-LED chip 10 emitting a peak wavelength of either 450 nm or 490 nm, depending on the structure of its active layer. The LED chip 10 is manufactured as part of a wafer containing many thousands of LEDs. The wafer may be broken along etched lines into small LED chips with sides approximately 25 microns. Since the growth substrate is removed, the chip 10 may be only a few microns thick, such as 3-10 microns thick. Forming GaN-based LEDs to emit light with peak wavelengths of 450 nm and 490 nm is well known.

Typically, the GaN-based LED semiconductor layers are grown on a sapphire substrate or other suitable growth substrate. N-type layers 12 are epitaxially grown, followed by an active layer 14, followed by p-type layers 16. The growth substrate is then removed, and ohmic contact to the n-type layers 12 is made by depositing a large, reflective metal alloy (or multiple metal layers) on the n-layers 12 to form a bottom electrode 18. Ohmic contact to the p-type layers 16 is formed by depositing a metal alloy on the p-layers 16 to form a top electrode 20. The top electrode 20 may be patterned to be dots, lines, a radial pattern, or other pattern to allow light to escape while distributing current to the p-layers 16. In an alternative embodiment, the large reflective electrode is formed over the p-layers 16, and the patterned electrode is formed over the n-type layers 12, where the light escapes through the n-type layers 12.

By forming the active layer with different stoichiometries of AlInGaN, the peak wavelength can be adjusted to be anywhere between blue and green. In the present disclosure, the wavelength of 450 nm will be referred to as blue, and the wavelength of 490 nm will be referred to as cyan, even though 490 nm is near the transition from blue to cyan. The 490 nm wavelength was chosen since it fills in a wavelength gap when a blue LED is used to excite a YAG phosphor (having a peak emission wavelength of about 575 nm). The 450 nm wavelength was chosen since the YAG phosphor is most efficiently excited by 450 nm LED chips emitting other than 450 nm and 490 nm may be used, depending on the phosphor used or other factors. Other types of phosphors can be used besides YAG. For example, a non-YAG yellow phosphor may be used in combination with a red phosphor. YAG will be used in the various examples.

Instead of phosphor, a quantum dots layer may be used in all embodiments to create white light or any other color light.

In one embodiment, the blue and cyan micro-LED chips 10 are mixed in a liquid medium (a solvent) to form an LED ink, whose viscosity is relatively low to allow the LED chips 10 to easily move through the medium. The ratio of the blue and cyan LED chips 10 in the medium is controlled to achieve the desired overall color of the LED lamp.

Figure 2:
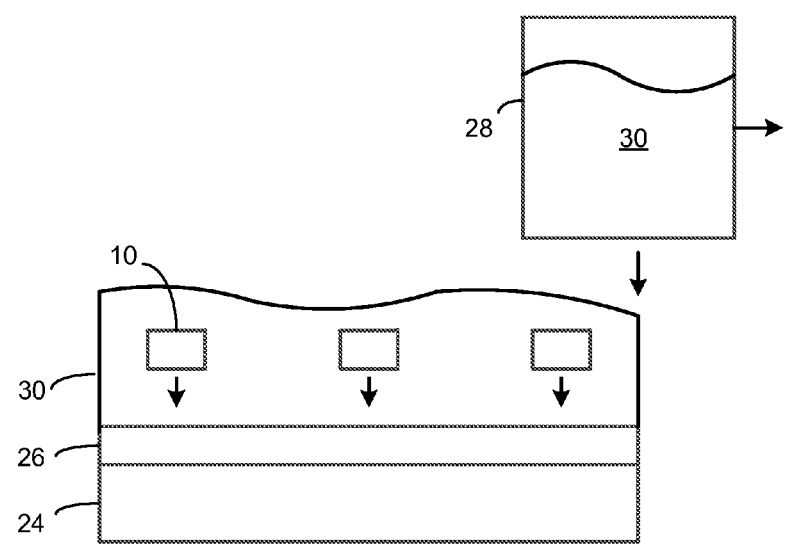
FIG. 2 illustrates LED ink (containing the micro-LED chips) being printed over an uncured aluminum layer on a substrate.

FIG. 2 illustrates a substrate 24, which may be a thin, flexible stainless steel sheet or a polymer sheet. The fabrication process may be a roll-to-roll process performed at atmospheric pressure. An uncured aluminum layer 26 is deposited over the substrate 24 such as by slot-die coating, spraying, printing, etc. The aluminum layer 26 is formed of particles of aluminum in a solvent.

A printing or spraying mechanism 28, containing the LED ink 30, is moved relative to the substrate 24 to deposit a thin layer of the LED ink 30 on the aluminum layer 26. The relatively high mass of the bottom electrodes 18 naturally orient the LED chips so that the bottom electrodes 18 face the aluminum layer 26. The structure is then heated (cured) by an overhead heater or laser to evaporate the solvents and fused the aluminum particles together to form a high conductivity metal layer. This also creates an ohmic bond between the bottom electrodes 18 and the aluminum layer 26. There will typically be many thousands or millions of LED chips 10 deposited over the aluminum layer 26.

Figure 3:
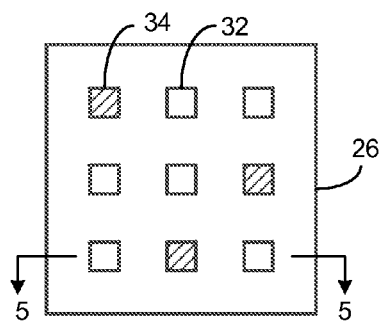
FIG. 3 is a top down view illustrating the 450 nm and 490 nm LED chips being randomly mixed over a small section of the substrate.

FIG. 3 is a simplified top down view of a small portion of the substrate 24 showing a random distribution of the blue LED chips 32 and the cyan LED chips 34. In the example, the ratio of blue LED chips 32 to cyan LED chips is two to one. Although the peak wavelengths of LED chips varies somewhat even within the same wafer, the average peak wavelength of the blue LED chips 32 is about 450 nm, and the average peak wavelength of the cyan LED chips 34 is about 490 nm.

Figure 4:
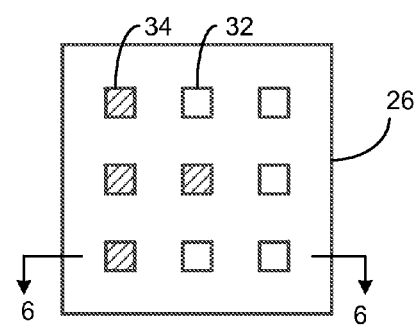
FIG. 4 is a top down view illustrating how the 450 nm and 490 nm LED chips may be separately printed in zones, such as strips, and a combination of 450 nm and 490 nm LEDs may be printed in other zones, to allow the different zones to be separately controlled by current sources to control the overall color.

In another embodiment, illustrated in FIG. 4, the blue LED chips 32 are deposited separately, such as by slot-die coating or screen printing, to be in specified zones on the substrate 24. The zones may be narrow strips or other shapes that allow the light from adjacent zones to mix to create a uniform color when viewed a certain distance from the lamp. The cyan LED chips 34 are also deposited separately to be in specified zones. There may also be a mixture of blue and cyan LED chips deposited separately. In the example of FIG. 4, the three groups of LED chips are deposited as very narrow strips (shown oriented vertically). Each strip may have many LED chips across its width, although the LED chips are shown to be linearly oriented along the length of each strip for simplicity.

Figure 5:
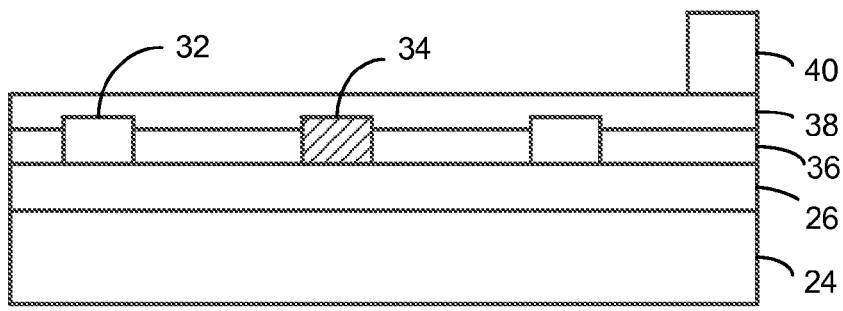
FIG. 5 is a cross-sectional view along line 5-5 in FIG. 3 illustrating the LED chips having their bottom electrodes bonded to an aluminum layer and their top electrodes contacted by a transparent conductor overlying the LED chips, connecting the LED chips in parallel.

FIG. 5 is a cross-sectional view along line 5-5 in FIG. 3. FIG. 5 illustrates a dielectric layer 36 deposited over the LED chips 32/34 by printing or spraying. The dielectric layer 36 partially encapsulates the chips and mechanically fixes the chips in place. The top portion of the dielectric layer 36 is then etched away, such as by a wet etchant, to expose the top electrodes of the LED chips 32/34. A transparent conductor layer 38 is then deposited over the LED chips 32/34 to connect them in parallel. The transparent conductor layer 38 may be deposited in zones to interconnect a group of LED chips 32/34 in parallel, and the various transparent conductor layer zones are effectively electrically isolated so they can be driven by different current sources. This also increases reliability and reduces the current needed to be delivered per current source. The transparent conductor may be deposited by screen printing, where the screen is patterned to print only through non-masked portions of the screen.

In another embodiment, the substrate 24 is a dielectric film, and the aluminum layer 26 is formed in electrically isolated zones. By also forming the transparent conductor layer 38 as zones, groups of parallel-connected LED chips can be connected in series on the same substrate to obtain any voltage drop across the series string.

Metal bus bars 40 are deposited at intervals to provide high conductivity paths from the current sources to the transparent conductor layer 38.

Figure 6:
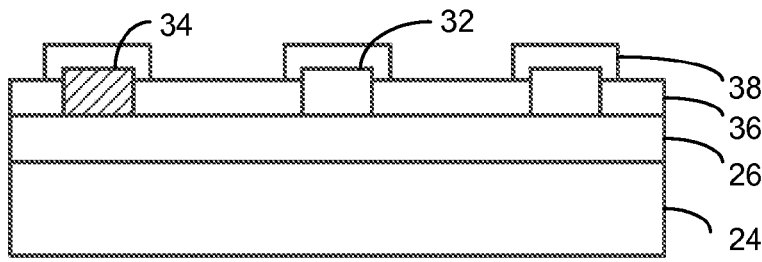
FIG. 6 is a cross-sectional view along line 6-6 in FIG. 4 illustrating the LED chips with their top electrodes contacted by separate strips of a transparent conductor for connecting the three strips of LEDs to three different current sources for separately controlling the strips of LED chips.

FIG. 6 is a cross-sectional view along line 6-6 in FIG. 4. Instead of the transparent conductor layer 38 being blanket deposited over the mixture of LED chips 32/34, as in FIG. 5, the transparent conductor layer 38 is selectively deposited, such as by screen printing, to only interconnect the LED chips in a single vertical strip in parallel, where the LED chips were separately deposited in the strips. This allows the blue LED chips 32 in the rightmost strip to be separately controlled by a current source, allows the cyan LED chips 34 in the leftmost strip to be separately controlled by another current source, and allows the mixture of LED chips 32/34 in the center strip to be separately controlled by another current source.

Figure 7:
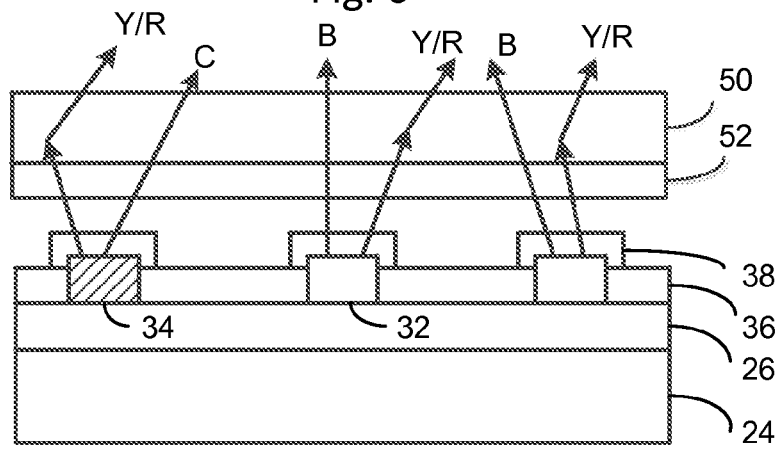
FIG. 7 illustrates a remote phosphor over the structure of FIG. 6.
Figure 8:
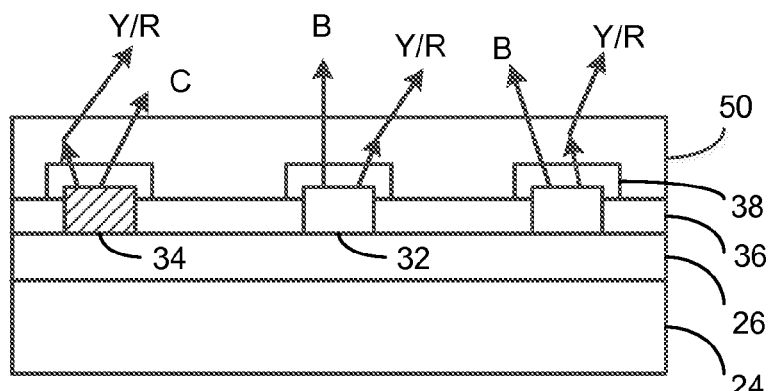
FIG. 8 illustrates a phosphor deposited directly on the LED chips of FIG. 6. The LED chips may first be encapsulated for protection and improved light extraction.

FIGS. 7 and 8 illustrate the structure of FIG. 6 being used with a phosphor layer. The structure of FIG. 5 may be used instead.

In FIG. 7, in one embodiment, a phosphor layer 50 may be a mixture of a YAG phosphor and a red phosphor, or a layer of a YAG phosphor and a layer of a red phosphor. The phosphor layer 50 is deposited on a transparent substrate 52, such as glass. The phosphor layer 50 is separated from the LED chips 32/34, so is a remote phosphor. The phosphor layer 50 may be formed as separate pieces and affixed over the LED chips 32/34 using any technique, such as by a transparent adhesive or a mechanical assembly. Providing a remote phosphor layer 50 improves mixing of the LED light, reduces the effects of light and heat on the phosphor, and allows the manufacturer to select a pre-formed phosphor layer having a desired characteristic to be used in the LED lamp to achieve a color specified by the customer, while not changing the LED chips 32/34.

The YAG/red phosphor will emit light having well defined characteristics. The phosphor emission is shown by the light rays Y/R. The blue LED chips 32 may be controlled by a current source to be brighter to add more blue to the white light output to increase the CCT. The blue emission is shown by the light rays B. The cyan LED chips 34 may be controlled by a current source to be brighter to add more green to the white light output. The cyan emission is shown by the light rays C. Other phosphors may be used instead of YAG to create white light.

If all the LED chips were connected in parallel, such as in FIG. 5, the ratio of the cyan LED chips 34 to the blue LED chips 32 is selected to boost the 490 nm output of the LED lamp a certain amount to create a broader spectrum of light to improve the CRI of the lamp.

FIG. 8 illustrates the structure of FIG. 6 with the phosphor layer 50 deposited directly over the LED chips 32/34, such as by spraying or printing. The use of the cyan LED chips 34 improves the CRI and LER of the LED lamp and allows the overall color to be dynamically controlled by changing the currents supplied to the various zones of LED chips.

Although the YAG phosphor is excited by the 490 nm emitted by the cyan LED chips 34, the excitation efficiency is not as great as with the 450 nm LED chips 32. Therefore, in one embodiment, the phosphor does not cover the cyan LED chips 34 but only covers the blue LED chips 32 to maximize efficiency. The cyan LED chips 34 then just supply the 490 nm wavelength that is substantially lacking in the YAG phosphor emission.

In another embodiment, the phosphor layer 50 comprises a yellow phosphor and a red phosphor that are energized by the blue LED chips 32. The cyan LED chips 34 contribute a cyan component to increase CRI, and the cyan LED chips 34 are optionally not covered with a phosphor. The blue LED chip 32 peak wavelength may be tuned to the peak excitation wavelength of the phosphors used without compromising CRI.

Since the blue and cyan LED chips have very similar structures, they can be driven by the same current, allowing them to be connected in parallel.

The peak emission of the cyan LED chip 34 may be anywhere within the cyan (blue-green) range while still achieving the benefits of the invention. The peak wavelength of the blue LED chip will typically be the most efficient energizing wavelength for the phosphor. The optimum peak wavelengths of the two types of LED chips are selected to improve CRI and LER and depend on the particular phosphors used and CCT or chromaticity to be generated. In one embodiment, the two LED type have a range between about 430 nm and 507 nm.

Figure 9:
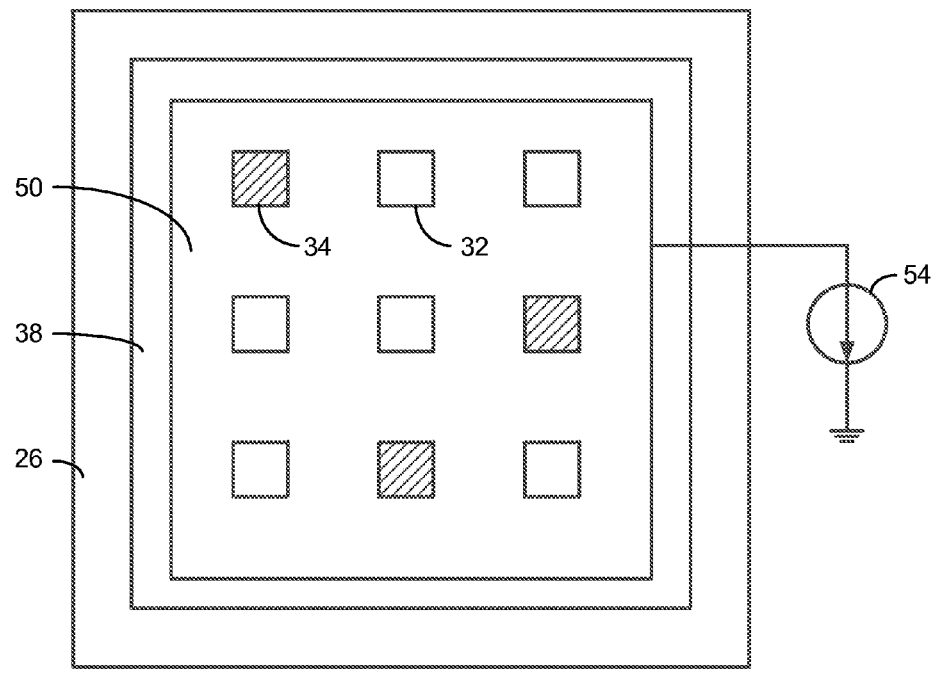
FIG. 9 is a top down view of a small portion of the substrate illustrating mixed LED chips coated with a transparent conductor, connecting the LED chips in parallel, and coated with a phosphor.

FIG. 9 is a top down view of a portion of a completed LED lamp with either a remote phosphor layer 50 or a phosphor layer 50 deposited directly over the LED chips. All the LED chips in FIG. 9 are driven in parallel by the current source 54, since the transparent conductor layer 38 connects together the top electrodes of all the LED chips. CRI is increased by the addition of the cyan LED chips 34 since some of the cyan emission passes through the phosphor layer 50.

Figure 10:
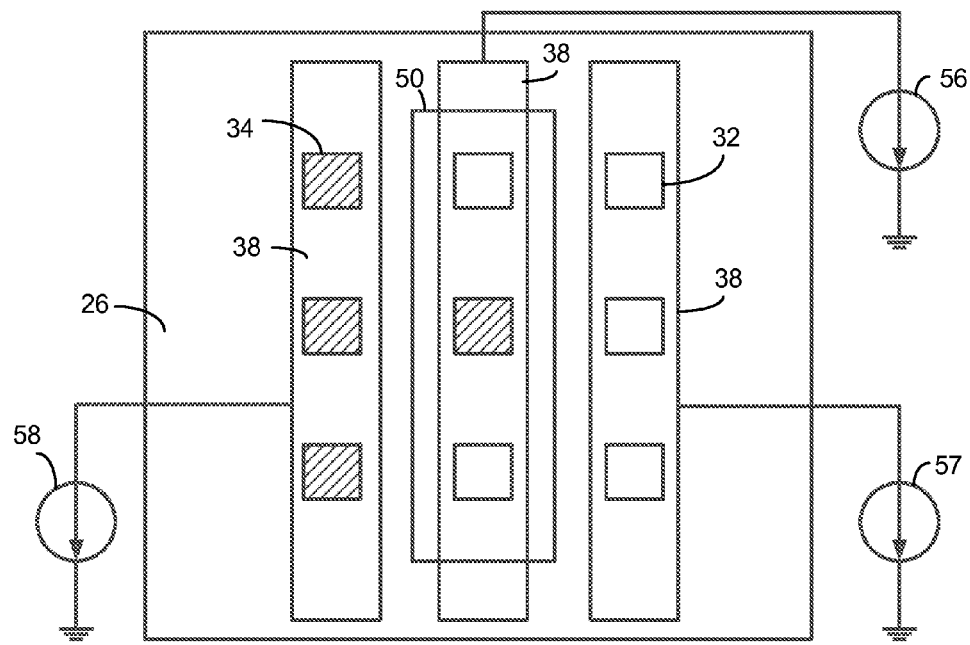
FIG. 10 is a top down view of a small portion of the substrate illustrating separately deposited groups of LED chips connected to different current sources, where only some of the LED chips are covered with a phosphor.

FIG. 10 is a top down view of a portion of another embodiment of a completed LED lamp with either a remote phosphor layer 50 or a phosphor layer 50 deposited directly over certain LED chips. In FIG. 10, the transparent conductor layer 38 is deposited in strips to only interconnect selected LED chips in parallel. If the aluminum layer 26 were segmented, the LED chips connected to the same segment may form a group of parallel LED chips that are connected in series with other groups of parallel LED chips.

In the example of FIG. 10, the phosphor layer 50 is only formed over the middle strip of LED chips. The leftmost strip of cyan LED chips 34 and the rightmost strip of blue LED chips 32 are not covered by a phosphor. Normally, there would be many more LED chips covered by the phosphor than not covered by the phosphor to generate a proper balance of wavelengths to produce white light. Each of the three strips of LED chips is controlled by its own current source 56, 57, 58 so that the color components of the white light may be adjusted to achieve a wide range of CCT, such as 2700K to 6500 K. All points on the Planckian locus may be possible. The LED chips and phosphor are designed to provide the lowest target CCT (e.g., 2700K) and, by increasing the currents to the separate blue and cyan LED chips, the CCT can be raised.

In another embodiment, blue and cyan LED chips are mixed together and connected in parallel for being controlled by the same current source. The ratio of the LED chips controls the color. A second group of either mixed LED chips or only blue LED chips is covered by phosphor or overlain with a remote phosphor, and the second group of LED chips is controlled by a separate current source. By controlling the relative currents of the two current sources, a wide range of CCTs is achievable, while increasing the CRI and improving the LER.

The aluminum layer 26 and transparent conductor layer 38 may be segmented in any manner to connect any number of LED chips in series and parallel.

A quantum dot layer may be used instead of the phosphor layer 50.

The current sources 56-58 may be automatically controlled during the day to sweep the CCT between two temperatures to mimic sunrise to sunset to correspond to the circadian rhythm.

In one embodiment, instead of using LED chips with a peak wavelength of 490 nm, LED chips with a peak wavelength of 507 nm are used since the scotopic response typically peaks at 507 nm. This would result in the lamp appearing brighter than actually measured by increasing the pupil lumens.

Figure 11:
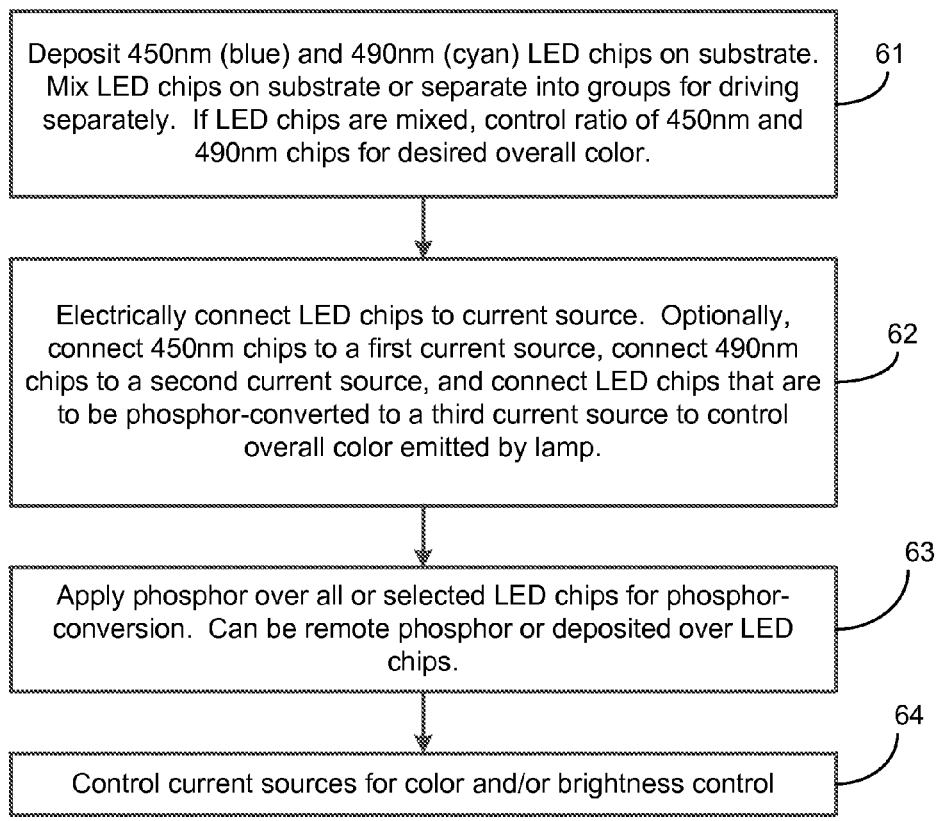
FIG. 11 is a flowchart identifying various steps used to form an LED lamp in accordance with one embodiment of the invention.

FIG. 11 is a flowchart summarizing various steps used for form an LED lamp in accordance with one embodiment of the invention. In step 61, blue and cyan LED chips are deposited on a substrate. The LED chips may be mixed or separated on the substrate. The ratio of the LED chips affects the resulting color.

In step 62, the LED chips are electrically interconnected and connected to current sources. The phosphor-converted LED chips in a group may be connected to one current source. The blue LED chips in a group may be connected to another current source. And, the cyan LED chips in a group may be connected to a third current source.

In step 63, a phosphor is selectively applied overlying all the LED chips or only over a selected group of LED chips. The phosphor may be a remote layer instead.

In step 64, the current sources are controlled to provide a desired mix of the blue, cyan, and phosphor wavelengths to achieve the desired CCT. CRI and LER may be optimized by the combination of LED chips and phosphor.

Figure 12:
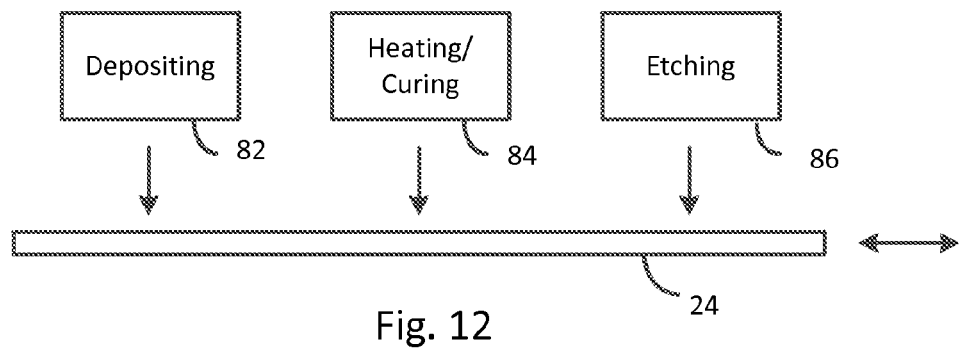
FIG. 12 illustrates a fabrication system used to form LED lamp panels.

FIG. 12 illustrates a fabrication system used to form LED lamp panels. The substrate 24 may be moved relative to the various stations. One or more depositing stations 82 are used for depositing the LED chips and various layers in any pattern, such as by using screen printing. A heating/curing station 84 cures the various deposited materials. An etching station 86 removes materials, as desired. All processes may be performed using a roll-to-roll process at atmospheric pressures to fabricate relatively large and inexpensive LED light panels. Each panel may comprise many thousands of LED chips that are interconnected in series and/or parallel.

Figure 13:
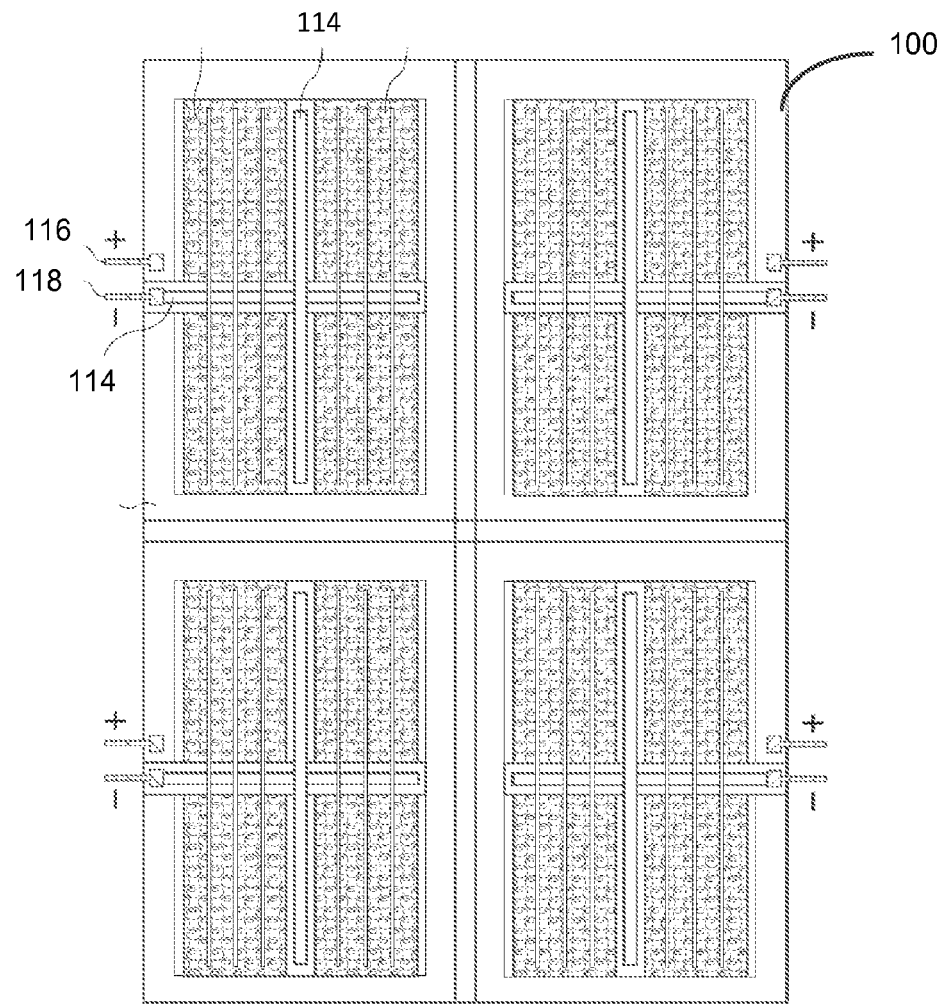
FIG. 13 illustrates multiple LED lamp panels being interconnected to form a luminaire, such as for being mounted in a ceiling for general illumination.

FIG. 13 illustrates four LED lamp panels 100 being interconnected to form a luminaire, such as for being mounted in a ceiling for general illumination. There may be many more panels in a single luminaire. Each panel 100 is made by any of the above-described processes and each contains many thousands of LED chips. A matrix of metal bus bars 114 is formed over the transparent conductor layer to provide high conductivity paths proximate to the LED chips. Electrical connectors 116 and 118 connect to the aluminum layer 26 (FIG. 2) and metal bus bars 114 for coupling a current to the various LED chips. There may be many more connectors for each panel if there are multiple, electrically isolated segments of LED chips that are to be separately controlled.

The various panels 100 are then connected in any combination of series and parallel by external conductors, such as wires or part of a frame, to achieve the desired voltage and current. The luminaire may replace a standard 2×4 foot fluorescent troffer.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A lighting device comprising:
a first light emitting diode (LED) having a first peak emission wavelength and generating blue light;
a second LED having a second peak emission wavelength, longer than the first peak emission wavelength, and generating a light greener than the blue light; and
a same wavelength-converting material over the first LED and the second LED for converting at least the blue light to longer wavelength light,
wherein light generated by the lighting device is a mixture of blue light from the first LED, greener light from the second LED, and longer wavelengths of light from the wavelength-converting material to create a white light.

2. The device of claim 1 wherein the first LED emits blue light and the second LED emits cyan light.

3. The device of claim 1 wherein the first peak emission wavelength is about 450 nm and the second peak emission wavelength is about 490 nm.

4. The device of claim 1 wherein the first peak emission wavelength and the second peak emission wavelength are between about 430-507 nm.

5. The device of claim 1 wherein the wavelength-converting material comprises a YAG phosphor.

6. The device of claim 1 wherein the wavelength converting material comprises a yellow phosphor.

7. The device of claim 1 further comprising:
a first plurality of LEDs emitting the first peak emission wavelength;
a second plurality of LEDs emitting the second peak emission wavelength; and
a third plurality of LEDs, including the first LED, emitting the first peak emission wavelength, the third plurality of LEDs energizing the wavelength-converting material, wherein a combined emission from the wavelength-converting material and the third plurality of LEDs produces white light.

8. The device of claim 7,
wherein the first plurality of LEDs is connected to a first current source,
wherein the second plurality of LEDs is connected to a second current source,
wherein the third plurality of LEDs is connected to a third current source, and
wherein the currents generated by the first current source, the second current source, and the third current source are controllable to create a desired emission from the device.

9. The device of claim 7 wherein the third plurality of LEDs comprises a mixture of LEDs emitting the first peak emission wavelength and the second peak emission wavelength, wherein the mixture of LEDs are connected in parallel.

10. The device of claim 9,
wherein the first plurality of LEDs is connected to a first current source,
wherein the second plurality of LEDs is connected to a second current source,
wherein the third plurality of LEDs is connected to a third current source, and
wherein the currents generated by the first current source, the second current source, and the third current source are controllable to create a desired emission from the device.

11. The device of claim 1 further comprising:
a first plurality of LEDs, including the first LED, emitting the first peak emission wavelength; and
a second plurality of LEDs, including the second LED, emitting the second peak emission wavelength,
wherein the first plurality of LEDs and the second plurality of LEDs are distributed on a substrate and driven by at least one current source, wherein a ratio of the first plurality of LEDs and the second plurality of LEDs is selected to achieve a desired emission from the device.

12. The device of claim 1 further comprising:
a first plurality of LEDs emitting the first peak emission wavelength; and
a second plurality of LEDs, including the second LED, emitting the second peak emission wavelength,
wherein the first plurality of LEDs and the second plurality of LEDs are printed on a substrate as an LED ink.

13. The device of claim 12 wherein the first plurality of LEDs includes the first LED and energizes the wavelength-converting material, and wherein the second plurality of LEDs also energizes the wavelength-converting material.

14. The device of claim 1 further comprising:
a first plurality of LEDs emitting the first peak emission wavelength; and
a second plurality of LEDs, including the second LED, emitting the second peak emission wavelength,
wherein the first plurality of LEDs and the second plurality of LEDs are printed on a substrate as an LED ink, the LED ink comprising the first plurality of LEDs and second plurality of LEDs mixed together in a solvent.

15. The device of claim 1 wherein the wavelength-converting material is separated from the first LED and the second LED.

* * * * *